(12) United States Patent
Atsumi et al.

(10) Patent No.: US 6,256,227 B1
(45) Date of Patent: Jul. 3, 2001

(54) NON-VOLATILE SEMICONDUCTOR MEMORY HAVING COLUMN SUB-SELECTOR LAYOUT PATTERN ADAPTABLE TO MINIATURIZATION OF MEMORY CELL

(75) Inventors: Shigeru Atsumi; Akira Umezawa, both of Yokohama; Toru Tanzawa, Ebina; Seiji Yamada, Tokyo, all of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/383,188

(22) Filed: Aug. 26, 1999

(30) Foreign Application Priority Data

Aug. 26, 1998 (JP) .................................. 10-240152

(51) Int. Cl.[7] .................................................. G11C 16/04
(52) U.S. Cl. ...................................................... 365/185.11
(58) Field of Search ........................ 365/185.11, 185.01, 365/185.13; 257/281, 282

(56) References Cited

U.S. PATENT DOCUMENTS 5,126,808    6/1992   Montalvo et al. .................. 357/23.5

*Primary Examiner*—Vu A. Le
*Assistant Examiner*—Vanthu Nguyen
(74) *Attorney, Agent, or Firm*—Banner & Witcoff, Ltd.

(57) ABSTRACT

A pattern constituted of a main bit line and four sub-bit lines is repeated around a column sub-selector of the flash EEPROM employing a double bit architecture having four block selection transistors per pitch of the pattern. In the flash EEPROM having a memory cell array and a column selector divided into a plurality of cell blocks $11_i$ and a plurality of column sub selectors $12_i$, respectively, the column sub-selector including repeated patterns each having four sub bit lines (SBLs) and a single main bit line (MBL) arranged in a column direction. In a pitch of the repeating pattern, active regions for four block selection transistors (BSTs) are arranged. Gate wiring layers of each of the block selection transistors are arranged above the active region in a row direction and four block decode lines ($BDL_i$) are arranged above the active region in the row direction.

10 Claims, 4 Drawing Sheets

NON-VOLATILE SEMICONDUCTOR MEMORY HAVING COLUMN SUB-SELECTOR LAYOUT PATTERN ADAPTABLE TO MINIATURIZATION OF MEMORY CELL

BACKGROUND OF THE INVENTION

The present invention relates to a non-volatile semiconductor memory, and more specifically, to a layout of a column selector of the non-volatile semiconductor memory having a double (two-layered) bit line structure for use in e.g., a flash EEPROM (electrically erasable programmable read-only memory).

In the semiconductor memory, in most cases, a word line and a bit line are divided in order to attain a high-speed read-out operation.

Particularly in a flash EEPROM, when a data rewrite operation to a certain memory cell is performed, other memory cells which share the same bit line or word line with the target memory cell, are placed in a semi-selection state, with the result that data stored in the other memory cells are altered. This phenomenon is called "disturbance during a data-rewrite mode". To prevent such a phenomenon, a memory cell array is divided into a plurality of blocks (cell-blocks) so that the word lines and bit lines of a block to be subjected to an erase operation can be electrically isolated from those of another block.

Generally, each cell block is constructed so as to have 512K bits (64K bites) constituting 1K word line×512 bit lines or 512 word lines×1 bit line. A row decoder and a column decoder are respectively divided into a plurality of row sub decoders and a plurality of column sub selectors, corresponding to a plurality of cell blocks.

Now, we will explain a column decoder of a conventional flash EEPROM.

In the flash EEPROM, the column selector, to which a selection signal is supplied from the column decoder, is constituted of a plurality of column sub-selectors which are arranged in every cell block of 512 K bits. The column sub-selectors are arranged in a discrete form. Size of a memory chip is influenced by the manner how to arrange wiring layers between the column sub-selectors. Furthermore, if a memory capacity increase, the number of cell blocks is inevitably increased, resulting in an increase of wiring resistance between column sub-selectors. To prevent such an increase in wiring resistance, a double-layer metal wiring (generally, aluminum wiring) has been generally employed as the wiring layer between the column sub-selectors.

FIG. 5 shows an equivalent circuit of part of a conventional NOR-type flash EEPROM employing a double bit line architecture which consists of double-layered aluminium wiring layers formed in a column direction of the memory cell array.

In FIG. 5, a plurality of cell blocks $51_i$ (i=1 to n) are arranged in a column direction of a memory cell array. In each of the cell blocks $51_i$, a plurality of cell transistors CTs constituting 512K bits are arranged in a matrix form.

In each of the cell block $51_i$, sub-word lines SWLs are arranged in a row direction. To each of the sub word lines, control gates of the cell transistors CTs belonging to the corresponding row are connected in common. Sub-bit lines SBLs are arranged in individual columns in the column direction. To each of the sub-bit lines, drains of the cell transistors CTs belonging to the corresponding row, are connected in common. To sources of the cell transistors CTs within each of the cell blocks $51_i$, a common block source line BSL is connected.

Main bit lines MBLs are extended in the column direction of the memory cell array. To each of the main bit lines MBLs, sub lit lines corresponding to a plurality of cell blocks $51_1$ to $51_n$ are connected in common.

Each of the column sub-selectors $52_i$ (i=1 to n) is extended at one side of the corresponding cell block $51_i$ in the column direction (vertical direction in FIG. 5). In each column sub-selector $52_i$, a plurality of block selection transistors (bit line selection transistor) (BSTs) are arranged in the row direction for selecting the corresponding sub-bit lines SBLs of the cell block $51_i$.

In the column sub-selector $52_i$, each of a plurality of block selection transistors BSTs is connected between the sub bit line SBL of the corresponding cell block $51_i$ and the corresponding main bit line MBL. Further, a block decode line BDL is extended in the row direction. To the block decode line BDL, the transistor BST gates are connected in common.

The main bit lines MBLs are collectively connected at each of one end thereof via the corresponding Y selection transistor (column selection transistor) CST. The main bit lines MBLs thus connected are further connected to a write load transistor (not shown), a sense-amplifier (not shown) and the like.

The column selection transistors CSTs are independently driven by a main column decoder (not shown). The block decode lines BDLs are independently driven by a block decoder and a column sub-decoder (not shown). The sub word lines SWLs are independently driven by a column sub-decoder (not shown). The block source line (BSL) is set so as to have a predetermined potential by a block source decoder (not shown) in accordance with an operation mode.

With the aforementioned construction, the sub bit lines arranged in every cell block are electrically isolated from those of other cell block by each of the column sub-selectors $52_i$.

In the aforementioned example, a single main bit line is arranged per single sub bit line. However, in some cases, a single main bit line is arranged per a plurality of sub bit lines. Furthermore in the aforementioned example, a plurality of column sub-selectors is arranged in parallel per single main bit line. In some cases, a single column sub-selector may be connected to a single main bit line.

FIG. 6 is an example of a practically and conventionally used pattern layout surrounding a column sub-selector $52_1$ for attaining the circuit shown in FIG. 5. More specifically, the figure shows a pattern layout having a single main bit line MBL and two sub bit lines SBLs (the single main bit line is formed in the midway of both two sub-bit lines, in parallel).

In FIG. 6, in a column sub-selector region, there are two block decode lines BDLs, a block source line BSL, a transistor active region SDG, a plurality of sub-bit lines SBLs, a main bit line MBL, and a plurality of gate wiring layer GLs. The two block decode lines BDLs are made of a first aluminium wiring layer and arranged in parallel to each other in a row direction. The block source line BSL is made of the first aluminum wiring layer and arranged in the row direction. The transistor active region SDG is formed selectively on a surface portion of a semiconductor substrate (alternatively a semiconductor layer or a well region) so as to extend in the row direction. The sub-bit lines SBLs are made of the first aluminium wiring layer and arranged in parallel to each other in a column direction. The main bit line MBL is made of a second aluminium wiring layer and arranged in parallel to the sub-bit line in the column direction. The gate wiring layers GLs are made of a polysilicon wiring layer and arranged in the column direction.

In this layout, a single active region SDG is constituted of adjacent two block selection transistors BSTs. The adjacent two block selection transistors BSTs share a common drain region. In addition, the sub-bit lines SBLs are extended in the column direction from above the corresponding source regions of the active regions SDGs. Each of the source regions is connected to the sub-bit line SBL at a contact portion 53.

Furthermore, the main bit line MBL is extended from above the common drain region of the active regions SDGs in the column direction. The main bit line MBL is connected to the common drain region by way of a connection line 54. More specifically, the connection line 54 is made of the first aluminium wiring layer and arranged above the common drain region. The common drain region and the connection line 54 are connected with each other at a contact portion 55. The connection line 54 is connected to the main bit line MBL through a via hole (through hole) 56.

The gate wiring layers GL are formed so as to extend in the column direction above channel regions formed between the source region and the common drain region of the active region SDG. One end of each of two gate wiring layers GLs corresponding to adjacent two block selection transistors BST is connected to the corresponding line of the two block decode lines BDLs via the corresponding contact portion 57.

When a single column sub-selector having the aforementioned pattern layout and a single column sub-selector having a symmetric pattern layout are arranged side by side in the column direction, it is possible to share the main bit line with two sub bit lines of each of the two column sub-selectors (in total, four sub-bit lines).

The pattern layout for use in the aforementioned conventional column sub-selector including the peripheral portion thereof is effective in the case where the pattern constituted of utmost 4 sub bit lines and a single main bit line, is repeated, and the active regions SDGs each having two transistors are arranged within one pitch width in the pattern.

However, when a device is miniaturized more and scale-down of the memory cell pitch is advanced, with the result that the interval between the bit lines is reduced, if the aforementioned conventional pattern-layout is used, the active regions corresponding to the two block selection transistors sometimes cannot be set within one pitch. In this case, it is necessary to modify the pattern layout in such a manner that a pattern having a single main bit line and 4 or 8 sub bit lines is repeated.

The reduction of the memory cell pitch due to the miniaturization of the device may also require, for example, a more effective or improved element isolation process. In this case, if a LOCOS process using a conventional selective oxidation film is changed to an STI (shallow Trench Isolation) process using a buried insulating-film, the depth of the source/drain can be regarded as the source/drain interval. As a result, the source/drain interval in a plane direction is significantly reduced.

In contrast, in the block selection transistor BST shown in FIG. 5, even if the device isolation process is changed, there is no factor to reduce the planar source/drain interval. Consequently, the margin for the pattern layout of the column sub-selector is inevitably reduced. It follows that the pattern layout must be modified so as to repeat a pattern constituted of a single main bit line and 4 or 8 sub bit lines.

When the pattern layout of the column sub-selector shown in FIG. 6 is viewed from the aforementioned points, in the regions where two block decode lines BDLs are arranged and where a block source line BSL of the first aluminium wiring is arranged, only wiring is present. These regions appear to be a complete dead-space in consideration of device arrangement. If a larger number of block decode lines is used for circuit design, the dead space is further enlarged.

The enlargement of the dead space in the memory such an NOR-type flash EEPROM whose cell-block bit capacity is defined by the standard, induces an increase of a pattern area of the column sub-selector, compared to the memory of a previous generation. Hence, if the aforementioned pattern is continuously used even though the device is miniaturized, a rate of the area occupied by the memory cell in the pattern will decrease.

In the meantime, in the conventional EEPROM, the device is designed in such a manner that transistors to be arranged around a row decoder and a column decoder (to which a high voltage Vpp (about 10V) is applied at a write/erase mode) have a junction resistance voltage of Vpp (about 10V) or more.

Particularly, in the flash memory where a negative voltage is applied to a word line at an erase operation, NMOS transistors constituting the row decoder and the column decoder, are usually formed within a p-well region formed on an n-well region of a p-type semiconductor substrate. In this case, the junction resistance voltage and the punch-through voltage of the NMOS transistors are usually set at Vpp or more.

However, if the aforementioned device structure of the NMOS transistor formed within the p-well region on the n-well region is directly employed as a device structure of the block selection transistor of the column selector, the following problems may arise.

(1) Increase of pattern layout area

In consideration of an alignment error of a mask pattern and the depth of a well region, any one of the block selection transistor, the boundary of the p-well region/n-well region, and the pattern layout of the cell transistor is arranged with a sufficient margin to form devices having uniform characteristics. However, it is not preferable to give a sufficient margin since the dead space between the column sub-selector and the cell block is increased due to the margin.

(2) Overspec of resistant voltage on device design

If the block selection transistor is designed so as to have a resistant voltage of Vpp (about 10V) or more, the following structural problems which prevent scale-down of the device are caused.

(a) A dose amount of the ion implantation performed to prevent the field-inversion of the NMOS region must be reduced in order to ensure the junction resistance voltage of Vpp (about 10V) or more of the block selection transistor. As a result, the interval between the n+drain region/n+ source region of the block selection transistor must be larger than that of the cell transistor. This is a serious matter when the pattern layout shown in FIG. 6 is employed.

(b) To ensure the punch-through resistance voltage of the block selection transistor at Vpp (about 10V) or more, its channel dope concentration must be increased. As a result, a vias effect of a substrate increases and the characteristics of a selected transistor come to deteriorate.

In particular, when a voltage of about 5V is applied to the source of a write load transistor (not shown) connected to one end of the column selection transistor CST shown in FIG. 5, it is not preferable that the threshold voltage of the block selection transistor BSL due to the substrate vias effect is large, since the large threshold voltage degrades characteristics of the block selection transistor.

As mentioned above, in a conventional non-volatile semiconductor memory employing a double bit line architecture, it is necessary to modify the pattern layout surrounding the column sub-selector, with the miniaturization of the device and reduction of the memory cell pitch.

Furthermore, if the device structure of each of the transistors arranged surrounding the decoder and its peripheral portion, the transistors being designed so as to have a junction resistance voltage and a punch-through voltage of at least Vpp (10V) (the voltage applied at the write operation in the non-volatile semiconductor memory), is directly employed as a device structure of the block selection transistor of the column sub-selector, various problems are produced.

BRIEF SUMMARY OF THE INVENTION

The present invention has been achieved in view of the aforementioned circumstances. An object of the present invention is to provide a non-volatile semiconductor memory having a double bit line architecture, which has an improved pattern layout around a column sub-selector, and which is capable of dealing with miniaturization of a device and reduction of a memory cell pitch. The pattern layout is constituted of repeated patterns, each having a single main bit line and a plurality of sub bit lines and each having a plurality of block selection transistors per pitch (width).

Another object of the present invention is to provide a non-volatile semiconductor memory wherein a block selection transistor and a cell transistor have the same impurity profile, and therefore are constructed in the same design standard.

According to a first aspect of the present invention, there is provided a non-volatile semiconductor memory having a double bit line architecture consisting of a plurality of cell blocks which are formed by dividing a memory cell array having cell transistors arranged in a matrix form, in a column direction and a plurality of column sub decoders having a block selection transistor formed next to and corresponding to the cell blocks in a column direction. The sub selector consists of repeated patterns, each constituted of a main bit line and predetermined sub-bit lines in a column direction. Within one pitch of the repeat pattern, active regions consisting of a plurality of block selection transistors are arranged in a row direction. Gate wiring layers of the block selection transistors and block decode lines connected to the gate wiring are arranged above the active region in a row direction.

According to a second aspect of the present invention, there is provided a non-volatile semiconductor memory wherein the block selection transistor and the cell transistor are arranged on semiconductor substrates formed in the same process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, embodiments of the present invention will be explained in detail with reference to the accompanying drawings.

As a first embodiment of the non-volatile semiconductor memory of the present invention, an NOR-type flash EEPROM employing a double bit line architecture will be explained as an example.

First Embodiment

Figure 1:
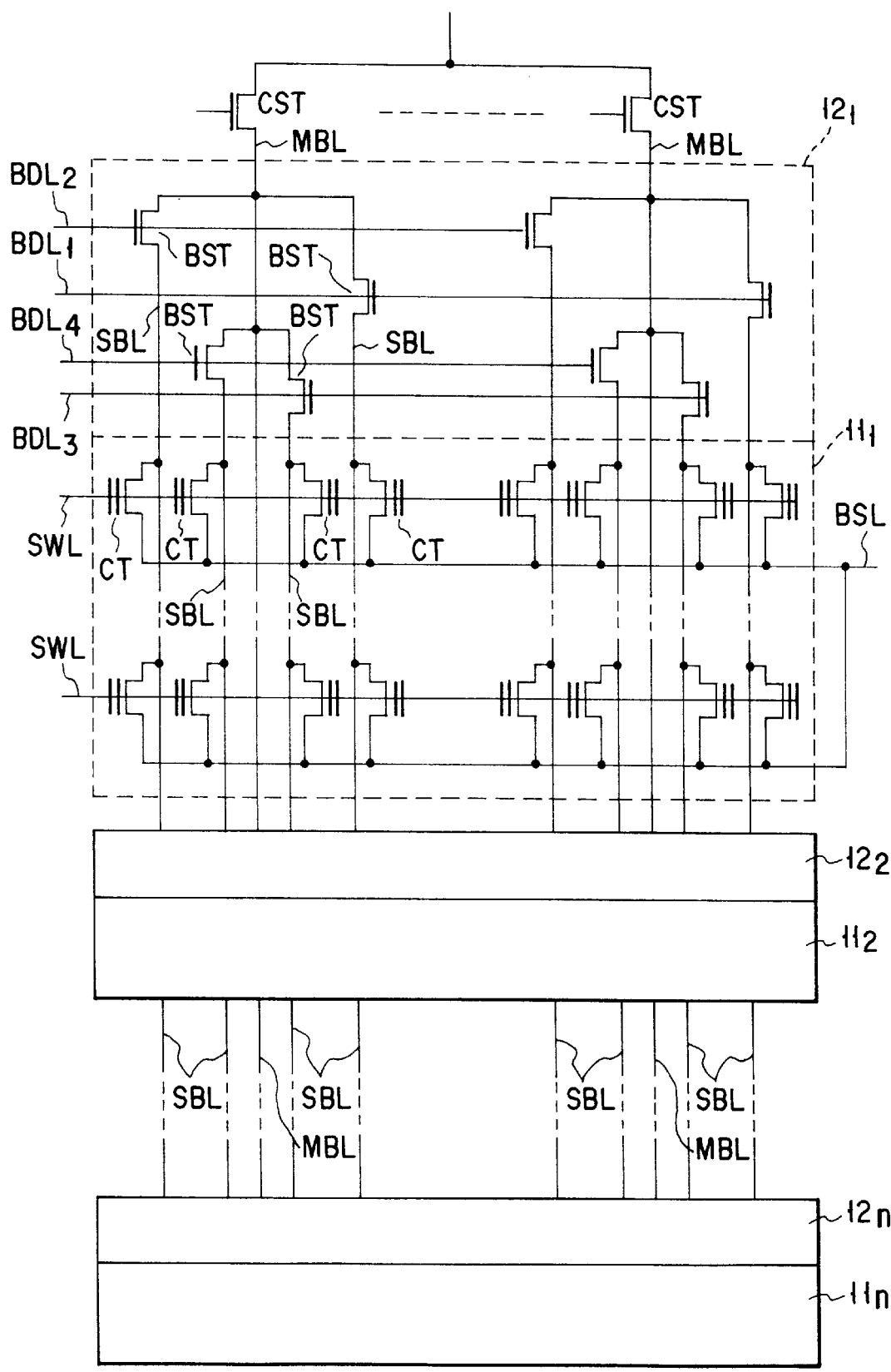
FIG. 1 is an equivalent circuit diagram showing part of an NOR-type flash EEPROM according to a first embodiment of the present invention.

FIG. 1 is an equivalent circuit diagram showing part of the NOR-type flash EEPROM according to the first embodiment of the present invention.

In FIG. 1, a plurality of cell blocks $11_i$ (i=1 to n) are arranged in a column direction of a memory cell array. In each cell block $11_i$, a plurality of cell transistors CTs corresponding to 512K bits are arranged in a matrix form.

In each of the cell blocks $11_i$, sub-word lines SWL are extended in the row direction. Control gates of the cell transistors arranged on the same row are connected to a corresponding sub-word line. Furthermore, sub-bit lines SBLs are extended in the column direction. Drains of the cell transistors CT arranged on the same column are connected to a corresponding sub-bit line SBL. Sources of the cell transistors CTs in the cell block are connected to a single block source line BSL in common.

Main bit lines MBLs are extended in the column direction of the memory cell array in a ratio of one MBL to predetermined number m (4 lines herein) of sub-bit lines SBLs.

Column sub-selectors $12_i$ (i=1 to n) are arranged so as to correspond to cell blocks $11_i$. Each of column sub-selectors is arranged next to one side of the corresponding cell block in the column direction. In each sub-selector $12_i$, a plurality of block selection transistors (bit-line selection transistor) BSTs are provided for selecting the corresponding line of the sub-bit lines SBL in the cell block $11_i$.

Each of the block selection transistors BST is connected between a sub-bit line SBL and the main bit line MBL of the same group. Furthermore, gates of the corresponding bit-line selection transistors EST of each group are connected to a common block decode line $BDL_j$ (j=1 to m, herein).

The main bit lines MBLs of the cell block $11_i$ are collectively connected via the corresponding Y selection transistors (column selection transistors) at one end of each of MBLs, and further connected to a write-loading transistor and a sense amplifier (not shown).

In the meantime, column selection transistors CSTs are selectively driven by a main column decoder (not shown). The four block decode lines BDLj are selectively driven by a block decoder and a column sub-decoder (not shown). The sub-word lines (SWLs) are selectively driven by a row sub-decoder (not shown). The single block source line BSL is set at a predetermined potential by a block source decoder (not shown) in accordance with an operation mode.

Figure 2:
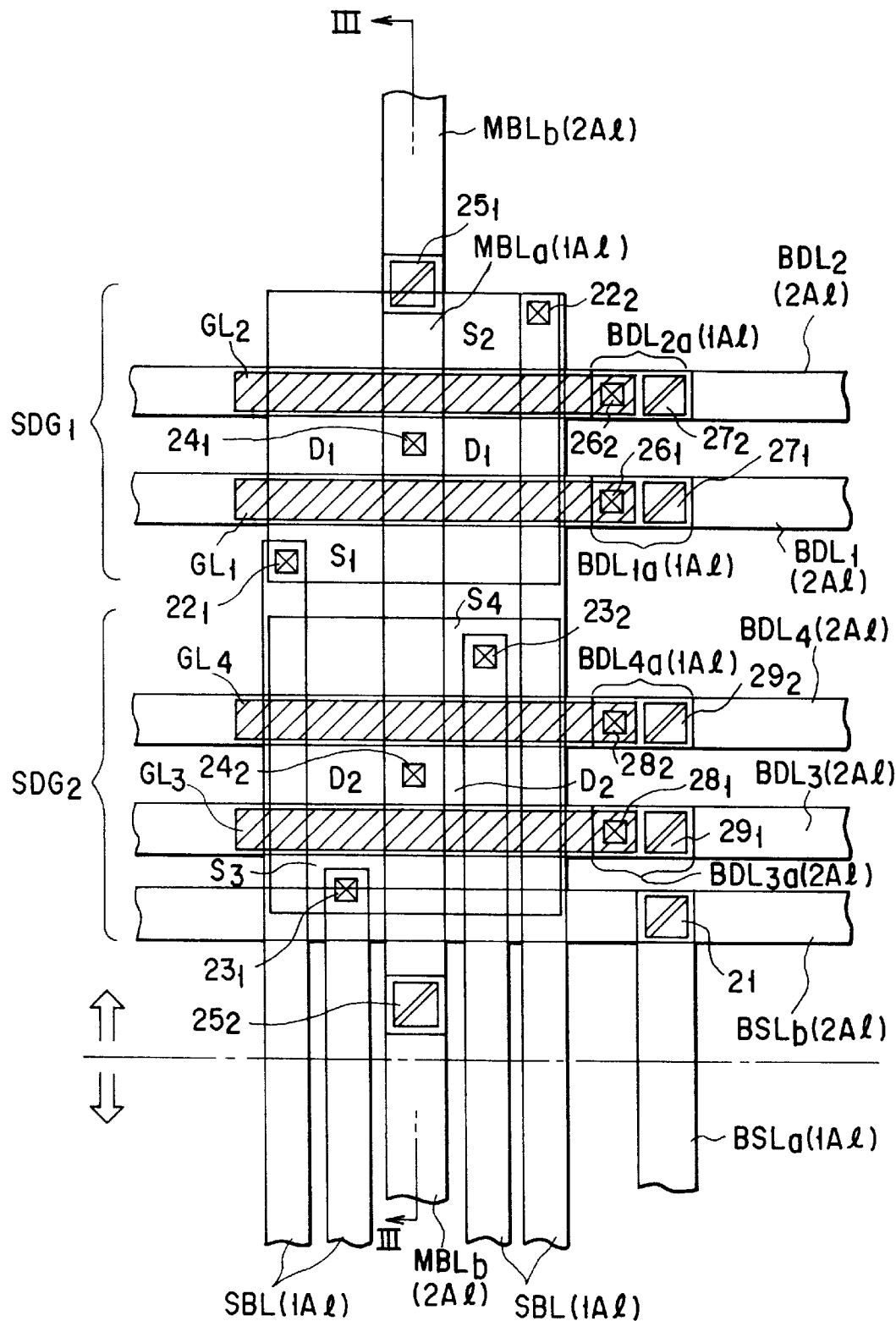
FIG. 2 is a view showing an example of a pattern layout surrounding a column sub-selector for attaining the circuit shown in FIG. 1.

FIG. 2 is a view showing an example of a pattern layout surrounding a column sub-selector $12_i$ shown in FIG. 1.

In this pattern layout, a pattern having a single main bit line MBL and four sub-bit lines SBLs, is repeated. In the pitch (width) of one pattern, block selection transistors BSTs are arranged in a direction perpendicular to a bit line (SBL, MBL) direction. In this case, a single pitch pattern and a pattern of the single block source line BSL used by column sub-selectors in common are taken out and shown.

Figure 3:
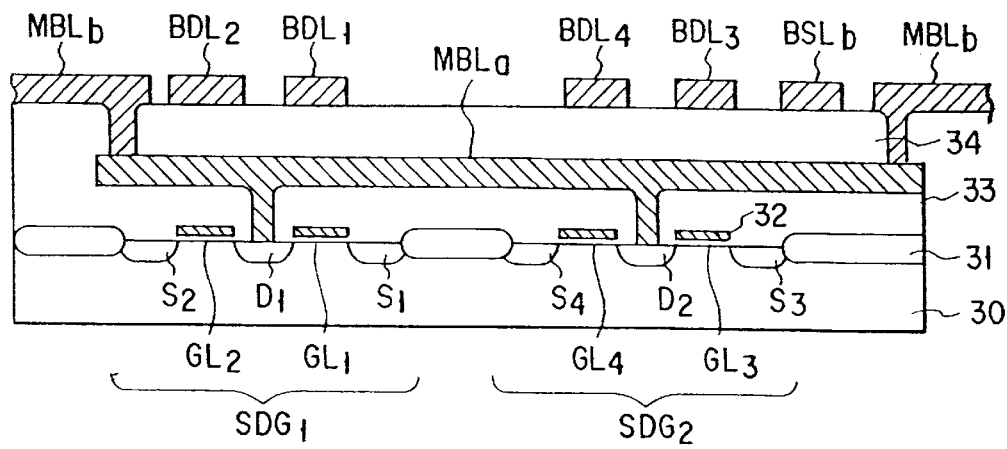
FIG. 3 is a cross-sectional view taken along the line III—III of FIG. 2.

FIG. 3 is a cross-sectional view taken along the main bit line relay connection line $MBL_a$ and the main bit line $MBL_b$ of the FIG. 1.

In FIG. 3, reference numeral 30 indicates a semiconductor layer. Reference numerals 31, 32 and 34 are an element isolation region (selective oxidation film), a gate insulating film, a first interlayer insulating film, and a second interlayer insulating film, respectively.

In FIGS. 2 and 3 in a single-pitch region of the column sub-selector $12_i$, a first SDG region ($SDG_1$) and a second SDG region $SDG_2$ which are formed in a surface region of the semiconductor substrate and arranged at a predetermined interval (element isolation region 31 arbitrarily constructed) in a column direction. Each of SDG regions $SDG_1$ and $SDG_2$ is constituted of two adjacent block selection transistors BSTs as a unit. These two pairs of adjacent block selection transistors share drain regions $D_1$ and $D_2$, respectively.

Furthermore, a first pair of two gate wiring layers (polysilicon) $GL_1$, $GL_2$, and a second pair of two gate wiring layers (polysilicon) $GL_3$, $GL_4$ are arranged. The $GL_1$ and $GL_2$ are formed along the row direction so as to pass above respective channel regions of the two transistors BSTs in the first SDG region $SDG_1$. The $GL_3$ and $GL_4$ are formed along the row direction so as to pass above respective channel regions of the two transistors BSTs in the second SDG region $SDG_2$.

Furthermore, a first pair of two sub-bit lines SBLs and a second pair of two sub-bit lines SBLs are arranged. The first pair of SBLs are formed of a first metal wiring layer (e.g., aluminum) and extended in parallel in a column direction from above respective source regions $S_1$, $S_2$ of the first SDG region $SDG_1$ toward the upper portion of the cell block. The SBLs of the second pair are formed of a first metal wiring layer (e.g., aluminum) and extended in parallel in a column direction from above respective source regions $S_3$, $S_4$ of the second SDG region $SDG_2$ toward the upper portion of the cell block.

Furthermore, a single main bit line relay connection line $MBL_a$ and a single first-layer block source line $BSL_a$ are arranged. The $MBL_a$ is formed of the first aluminium wiring layer and extended in the column direction so as to pass over the two SDG regions $SDG_1$, $SDG_2$. The $BSL_a$ is formed of the first aluminium wiring layer and extended in the column direction so as to direct from a region outside the SDG region toward the upper portion of the cell block.

Furthermore, a first pair of two block decode lines $BDL_1$, $BDL_2$ and a second pair of two block decode lines $BDL_3$, $BDL_4$ are arranged. The first pair of $BDL_1$ and $BDL_2$ are formed of a second metal wiring layer (e.g., aluminium) and extended in parallel to each other in the row direction so as to pass over the first pair of two gate wiring layers $GL_1$, $GL_2$. The second pair of $BDL_3$ and $BDL_4$ are formed of a second metal wiring layer (e.g., aluminium) and extended in parallel to each other in the row direction so as to pass over the second pair of two gate wiring layers $GL_3$, $GL_4$.

Furthermore, a single second-layered block source line $BSL_b$ and a single main bit line $MBL_b$ are arranged. The $BSL_b$ is formed of a second aluminium wiring layer and extended in parallel to the block decode lines ($BDL_j$) in the row direction. The $MBL_b$ is formed of the second aluminium wiring layer and extended in parallel to the sub-bit line (SBL) in the column direction from above both ends of the main bit line relay connection line $MBL_a$.

In this case, the second layer block source line $BSL_b$ is connected to one end portion of the first layer block source line $BSL_a$ through a via-hole 21 in the region outside each of the SDG regions $SDG_1$, $SDG_2$.

In addition, the first pair of two sub bit lines SBLs are in contact with the source regions S1 and S2 of the first SDG region $SDG_1$ at the corresponding contact portions $22_1$, $22_2$.

Similarly, the second pair of two sub bit lines SBLs are in contact with the source regions $S_3$ and $S_4$ of the second SDG region $SDG_2$ at contact portions $23_1$, $23_2$.

The main bit line relay connection line $MBL_a$ is in contact with the common drain region $D_1$ of the first SDG region $SDG_1$ at a contact portion $24_1$; at the same time, in contact with the common drain $D_2$ of the second SDG region $SDG_2$ at a contact portion $24_2$. Both ends of the $MBL_a$ are in contact with the main bit lines $MBL_b$ through via-holes $25_1$ and $25_2$, respectively.

Furthermore, in the region outside the first SDG region $SDG_1$ above the first pair of two gate wiring layers $GL_1$ and $GL_2$, block decode line relay connection lines $BDL_{1a}$ and $BDL_{2a}$ of the first aluminium wiring layer are formed in the row direction.

The $BDL_{1a}$ and $BDL_{2a}$ are in contact with the first pair of two gate wiring layers $GL_1$ and $GL_2$ at contact portions $26_1$ and $26_2$, respectively; at the same time, in contact with the first pair of two block decode lines $BDL_1$, $BDL_2$ through via-holes $27_1$, $27_2$. In this case, the via-holes $27_1$, $27_2$ may be formed above the contact portions $26_1$, $26_2$ corresponding thereto.

Furthermore, in the region outside the second SDG region ($SDG_2$) above the two second gate wiring layers $GL_3$, $GL_4$, block decode line relay connection lines $BDL_{3a}$, $BDL_{4a}$ of the first aluminium wiring layer are formed in the row direction.

The $BDL_{3a}$ and $BDL_{4a}$ are in contact with the second pair of two gate wiring layers $GL_3$ and $GL_4$ at contact portions $28_1$ and $28_2$, respectively; at the same time, in contact with the second pair of two block decode lines $BDL_3$, $BDL_4$ through via-holes $29_1$, $29_2$. In this case, the via-holes $29_1$, $29_2$ may be formed above and corresponding to the contact portions $28_1$, $28_2$.

In each of the cell blocks, to a common sub bit line SBL, drains of a plurality of cell transistors CTs arranged in the same line, are connected. To a common first-layer block source line $BSL_a$, sources of a plurality of cell transistors (CTs) are connected. Control gates of a plurality of cell transistors CTs arranged in the same row are connected to a common subword line SWL.

In other words, the flash EEPROM according to the first embodiment, a memory cell array having cell transistors CTs arranged in a matrix form is divided into a plurality of cell blocks $11_i$ in a column direction. Simultaneously, the present invention employs a double bit line architecture in which a plurality of the column sub-selectors $12_i$, each having a block selection transistor BSL, are arranged discretely in a column direction with respect to the column selectors arranged corresponding to columns of a cell block.

The cell block $11_i$ has a plurality of polysilicon sub-word lines SWLs and a plurality of sub-bit lines SBLS formed of the first metal wiring layer. The cell transistor CT is arranged at an intersection of the SWL and SBL. Furthermore, a single main bit line $MBL_b$ is formed of the second metal wiring layer and arranged in parallel to a plurality of sub-bit lines (or a single sub-bit line). In addition, a first block source line $BSL_a$ of the first metal wiring layer connected to each of the sources of the cell transistors CTs is arranged in parallel to the sub-bit line SBL.

In the column sub-selector $12_i$ arranged at one side (or may be arranged at both sides) of the column direction of the cell block $11_i$, the block selection NMOS transistor BST, whose source is connected to the sub-bit line SBL, is arranged.

In this case, above the region of the block selection NMOS transistor BST, the main bit line relay connection line $MBL_a$, which is formed of the first metal wiring layer and connected to one end of the main bit line $MBL_b$, is arranged in an extension direction of the main bit line $MBL_b$.

To the main bit line relay connection line $MBL_a$, the drain of block selection transistor BST is connected.

Furthermore, a control signal is input from the block decode line $BDL_j$, which is formed of the second metal wiring layer and arranged nearly in perpendicular to the main bit line relay connection line $MBL_a$, to the gate of the block selection transistor BST. In this case, above the channel region of the block selection transistor BST, the gate wiring layer $GL_j$ formed of the polysilicon wiring is arranged in a direction substantially parallel to the main bit line relay connection line $MBL_a$. The gate wiring layer $GL_j$ is further connected to the block decode line $BDL_j$.

A second block source line $BSL_b$, which is formed of the second metal wiring layer and arranged in a direction substantially parallel to the main bit line relay connection line $MBL_a$, is connected to one end of the first block source line $BSL_a$.

Note that if the block selection transistor BST is constructed in the same stack gate structure as that of the cell transistor CT and a signal of the block decode line is applied to a lower gate of the stack-gate structure, it is possible to form gates of the block selection transistor and of the cell transistor, simultaneously.

More specifically, according to the pattern layout surrounding the column sub-selector $12_i$ of the first embodiment, sub-bit lines SBLs formed of the first aluminium wiring layer are extended from above each source region of the SDG region of the block selection transistor BST in the cell-block direction. The main bit line relay connection line $MBL_a$ consisting of the first aluminium wiring layer is formed so as to pass over the SDG region in a column direction. The main bit line $MBL_b$ made of the second aluminium wiring layer is formed in an extension direction so as to be contact with both ends of the $MBL_a$. The block decode line $BDL_j$ made of the second aluminium wiring layer is formed so as to pass over the SDG region in a row direction.

Furthermore, as the block source line BSL shared with the column sub-selectors $12_i$ in common, a first block source line $BSL_a$ consisting of the first aluminium wiring layer is formed in the region outside above the SDG region. Further, a second block source line $BSL_b$ consisting of the second aluminium wiring layer is then brought in contact with the first block source line.

In this way, the SDG region corresponding to four block selection transistors BSLs can be arranged below the block decode line $BDL_j$ within one-pitch of the repeating pattern constituted of a single main bit line MBL and four sub-bit lines SBLs. Simultaneously, the block source line BSL shared with the column sub-selectors $12_i$ in common is arranged without a hitch.

Second Embodiment

The second embodiment is characterized in that a manufacturing process of the block selection transistor BST is matched with the manufacturing process of the cell transistor CT. Now, its reasons and how to match them will be explained more specifically.

In the second embodiment, a single main bit line MBL is arranged every four sub-bit lines SBLs, as described above. A write circuit system to the memory cell array having a plurality of cell blocks $11_i$ having a common source line BSL, which is used corresponding to the sub selectors $12_i$, arranged in the column direction, is improved as described below.

Figures 4, 5:
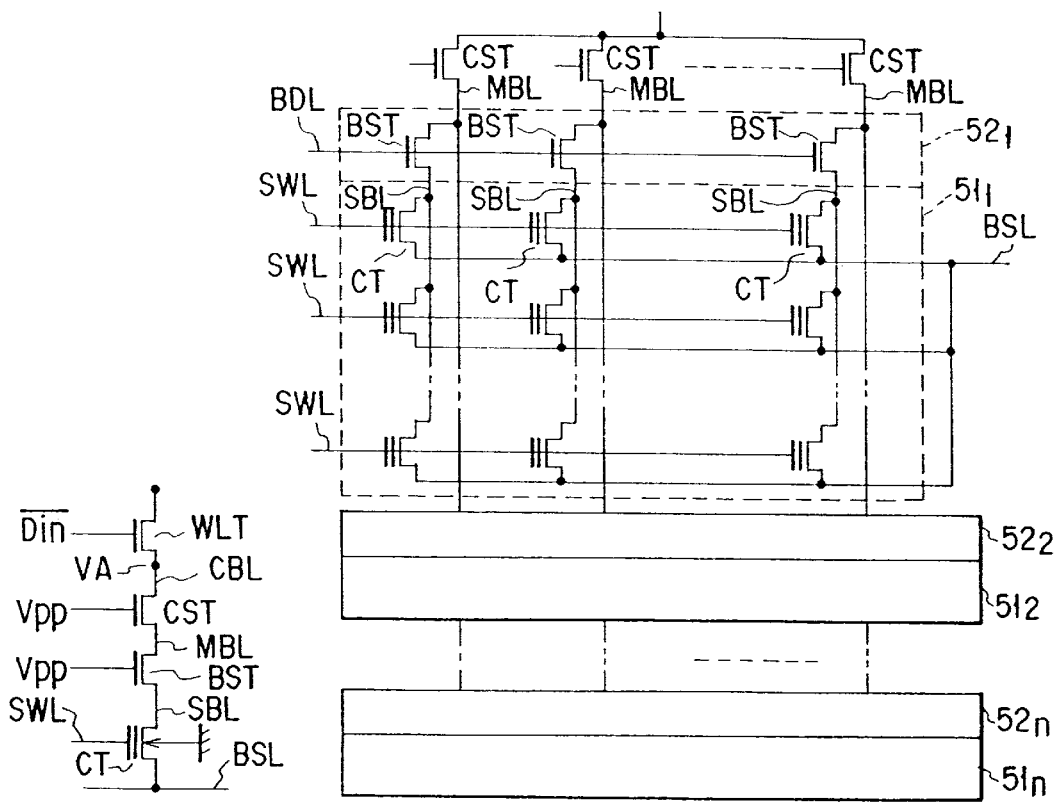
FIG. 4 is an equivalent circuit diagram corresponding to one column in the write circuit system shown in FIG. 1.
FIG. 5 is an equivalent circuit diagram of part of a conventional NOR-type flash EEPROM employing a double bit line architecture having a double-layered aluminium wiring in a column direction of the memory cell array.
Figure 6:
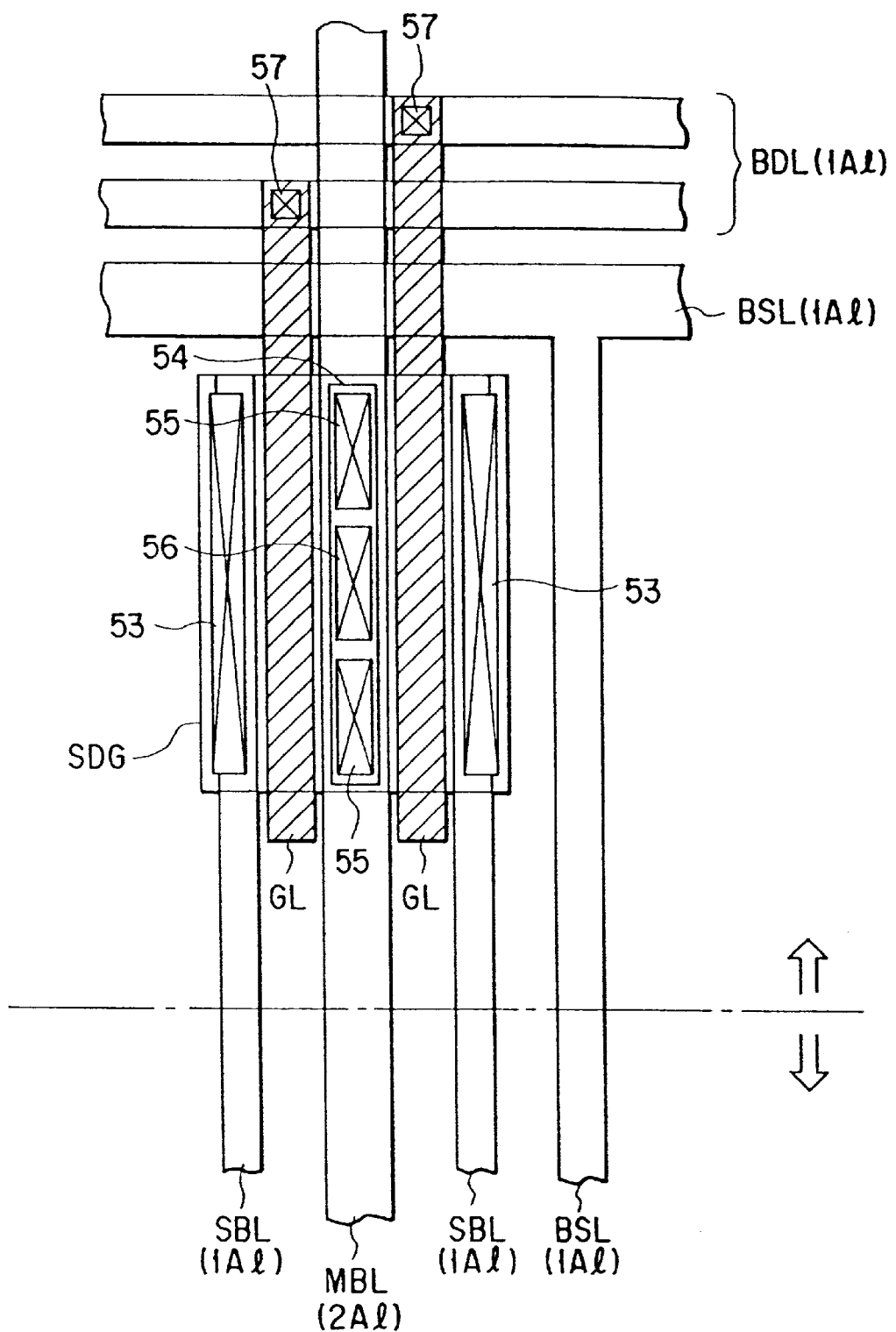
FIG. 6 is a view showing a conventional pattern layout surrounding a column sub-selector for attaining the circuit shown in FIG. 5.

FIG. 4 shows a schematic equivalent circuit corresponding to one column of the aforementioned write circuit system. More specifically, the figure shows how to flow a cell current when a write operation is performed to a selected cell transistor by use of channel hot electrons.

In FIG. 4, reference symbols, SBL and CT represent a sub-bit line and a cell transistor connected to the sub bit line, respectively. Reference symbols, BSL, SWL, BST and MBL represent a block source line, a sub-word line, a block selection transistor, and a main bit line, respectively. Symbol CST is a Y selection transistor. CBL is a common bit line to which Y selection transistors arranged in a plurality of columns are collectively connected. Symbol WLT is a write-load transistor having the gate to which write data /Din ("1" or "0") are applied.

In the write circuit shown in FIG. 4, when the cell transistor CT is selected and written, a source voltage VA ("H" level) of the cell transistor is limited to about 5V when the write data /Din is "0". Accordingly, when the write data /Din to be applied to the gate of the write load transistor WLT is "0", the voltage VB is given by:

VB=VA+Vth where Vth is a threshold gate voltage of the write load transistor WLT.

In the Y selection transistor CST and the block selection transistor BST, a write voltage Vpp (>VB) is applied to each gate when selected, while a source voltage VA of the write load transistor WLT is directly passed and applied to the drain of the cell transistor CT. More specifically, neither of transistor WLT nor CT has the function of controlling the drain voltage of the cell transistor CT.

According to the aforementioned structure, a voltage in excess of the drain voltage VA of the cell transistor CT at the write operation is not applied to the drain/source of the Y selection transistor CST and the drain/source of the block selection transistor BST.

Therefore, a junction resistance voltage and a punch-through voltage of the block selection transistor BST may be the same as those of the cell transistor CT. Since VA is applied up to about 5V to the drain of the block selection transistor BST, there is a possibility that the channel length of the block selection transistor BST is reduced.

Now, as the second embodiment, how to match the manufacturing process of the block selection transistor BST and the manufacturing process of the cell transistor CT will be described below more specifically.

(1) the block selection transistor BST and the cell transistor CT are arranged on semiconductor layers formed in the same process, respectively. In this case,
  (a) when the cell transistor CT is formed on a p-type silicon substrate, the block selection transistor BST is also formed on the p-type silicon substrate.
  (b) when the cell transistor CT is formed in a p-well region on an n-well region, as is in the case where a negative voltage is applied to a control gate of the cell transistor CT during an erase operation, the block selection transistor BST is also formed within the p-well region on the n-well region. However, the p-well region forming a cell and the p-well region forming a column sub-selector may sometimes need to be electrically isolated.

(2) implantation performed to prevent field inversion of the cell region and implantation performed to prevent field inversion of the column sub-selector region are performed in the same PEP (photo etching process).

(3) channel implantation of the cell region and that of the column sub-selector region are performed in the same PEP.

In this manner, the block selection transistor BST and the cell transistor CT have the same impurity profile, so that the block selection transistor BST and the cell transistor CT can be constructed in accordance with the same design standard.

Third Embodiment

In the second embodiment, the manufacturing process of the block selection transistor BST is matched with the manufacturing process of the cell transistor CT of the cell block $11_i$. However, in the cases of the Y selection transistor CST connected to the block selection transistor BST or the Y selection transistor CST connected directly to the cell transistor without passing through the block selection transistor due to different cell array structure, if its manufacturing process for BST is matched with that of the cell transistor CT, the same effect as obtained in the second embodiment can be obtained.

In this case, since VA is applied up to about 5V to the drain of the Y selection transistor CST, it is possible to reduce the channel length of the Y selection transistor CST. Furthermore, the Y selection transistor CST is formed so as to have the same stack gate structure as is in the cell transistor CT and a column selection signal is applied to the gate of a lower layer of the stack gate structure, the gate of the Y selection transistor CST and that of the cell transistor CT can be simultaneously formed.

According to the present invention, if the double bit line architecture is employed, it is possible to provide a non-volatile semiconductor memory with a pattern layout (surrounding the column sub-selector) which enables the arrangement of a plurality of block selection transistors within one pitch of the repeating pattern constituted of a single main bit line and a predetermined number of sub-bit lines, in order to deal with miniaturization of the device and reduction of the memory cell pitch.

Furthermore, according to the present invention it is possible to provide a non-volatile semiconductor memory having the block selection transistor and the cell transistor having the same impurity profile and therefore, they can be formed in accordance with the same design standard.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A non-volatile semiconductor memory device employing a double bit line architecture, comprising:
   a memory cell array having cell transistors arranged in a matrix form, said memory cell array being divided into a plurality of cell blocks in a column direction; and
   a plurality of column sub-selectors provided next to the corresponding cell blocks, in the column direction, said plurality of column sub selectors each having block selection transistors which are provided so as to correspond to columns in the corresponding cell block,
   wherein,
       said column sub-selectors each including repeated wiring patterns in a row direction, each of said repeated wiring patterns including a single main bit line and a predetermined number of sub-bit lines arranged in the column direction;
       activation regions including said block selection transistors are arranged in the row direction next to each other within a pitch of said pattern; and
       gate wires of the block selection transistors and block decode lines connected to the gate wires, are extended in the row direction above each of the activation regions.

2. The non-volatile semiconductor memory according to claim 1, wherein
   each of said sub-bit lines is formed of a first metal wiring layer and extended from above a source region of the active region of the corresponding block selection transistor, towards a corresponding cell block, and one end of the sub-bit line is connected to the source region,
   each of said main bit lines comprises:
       a main bit line relay connection line made of the first metal wiring layer, extended above the active region of the corresponding block selection transistors, in the column direction, and connected to drain regions of the active regions at one end thereof; and
       main bit line portions made of a second metal wiring layer, extended in an extension direction of the main bit line relay connection line, and connected to both ends of the main bit line relay connection line, and
   said block decode line is formed of the second metal wiring layer, extended above the active region and above the gate wiring toward the row direction, and connected to the gate wiring.

3. The non-volatile semiconductor memory according to claim 2, further comprising:
   a block source line arranged in each of said plurality of cell blocks, and connected to each of source regions of cell transistors arranged in the same cell block;

wherein,
said block source line has a first block source line made of the first metal layer and formed in the column direction, and a second block source line made of the second metal wiring layer and formed in the row direction.

4. The non-volatile semiconductor memory according to claim 1, wherein
a region within the pitch of the pattern repeated in the column sub-selector, includes:
a first active region and a second active region which are formed in a surface portion of the semiconductor substrate and selectively arranged side by side at a predetermined interval in the column direction, each of said first active region and said second active region having two adjacent block selection transistors arranged in the row direction so as to share a common drain region;
a first pair of two gate polysilicon wires each being extended in the row direction above the channel region of a corresponding one of the two adjacent block selection transistors arranged in the first active region;
a second pair of two gate polysilicon wires each being extended in the row direction above the channel region of a corresponding one of the two adjacent block selection transistors arranged in the second active region;
a first pair of two sub-bit lines made of the first metal wiring layer in the column direction and extended from the source regions of the first active region toward above the cell block;
a second pair of two sub-bit lines made of the first metal wiring layer in the column direction and extended from the source regions of the second active region toward above the cell block;
a single main bit line relay connection line made of the first metal wiring layer in the column direction and extended above the first and second active regions;
a first pair of two block decode lines made of the second metal wiring layer in the row direction and extended above the first pair of two gate polysilicon wires;
a second pair of two block decode lines of the second metal wiring layer and extended above the second pair of two gate polysilicon wires; and
a main bit line made of the second metal wiring layer and extended in the column direction from above both ends of the main bit line relay connection line.

5. The non-volatile semiconductor memory according to claim 4, wherein
said first pair of two sub-bit lines are connected to corresponding source regions of the first active region via contact portions;
said second pair of two sub-bit lines are connected to corresponding source regions of the second active region via contact portions;
said main bit line relay connection line is in contact with a common drain region of the first active region through a contact portion and simultaneously in contact with a common drain region of the second active region through a contact portion, both ends of said main bit line relay connection line being in contact with the main bit line through via holes;
a first pair of block decode line relay connection lines made of the first metal wiring layer, are formed in the row direction in a region above the first pair of two gate polysilicon wires and outside the first active region;
said first pair of block decode line relay connection lines are respectively in contact with said first pair of two gate polysilicon wires at contact portions and in contact with said first pair of two block decode lines through via holes;
a second pair of block decode line relay connection lines made of the first metal wiring layer are formed in the row direction in a region above the second pair of two gate polysilicon wires and outside the second active region; and
said second pair of block decode line relay connection lines are in contact with said second pair of two gate polysilicon wires at contact portions and simultaneously in contact with said second pair of two block decode lines through via holes.

6. The non-volatile semiconductor memory according to claim 1, wherein said block selection transistors and said cell transistors are respectively arranged on semiconductor layers formed in the same process.

7. The non-volatile semiconductor memory according to claim 6, wherein each of said block selection transistors has the same stack gate structure as that of each of the cell transistors, and a signal of the block decode line is applied to a lower-layer gate of the stack gate structure of the block selection transistor.

8. The non-volatile semiconductor memory according to claim 6, further comprising:
column selection transistors each being connected to a corresponding main bit line at an end thereof,
wherein
said column selection transistors and said cell transistors are arranged on the semiconductor layers formed in the same process.

9. The non-volatile semiconductor memory according to claim 8, wherein
each of said column selection transistors has the same stack gate structure as that of each of the cell transistors and a column selection signal is applied to a lower-layer gate of the stacked gate structure of the column selection transistor.

10. The non-volatile semiconductor memory according to any one of claims 1 to 9, wherein
said cell block has an NOR-type electrically erasable programmable read-only memory cell array.

* * * * *